United States Patent
Nagy et al.

(10) Patent No.: US 11,916,036 B2
(45) Date of Patent: *Feb. 27, 2024

(54) VACUUM DEPOSITION SYSTEM AND METHOD THEREOF

(71) Applicant: INTLVAC INC., Georgetown (CA)

(72) Inventors: Michael Nagy, Georgetown (CA); Dino Deligiannis, Georgetown (CA)

(73) Assignee: INTLVAC INC., Georgetown (CA)

( * ) Notice: Subject to any disclaimer, the term of this patent is extended or adjusted under 35 U.S.C. 154(b) by 18 days.

This patent is subject to a terminal disclaimer.

(21) Appl. No.: 17/368,628

(22) Filed: Jul. 6, 2021

(65) Prior Publication Data

US 2021/0335746 A1    Oct. 28, 2021

Related U.S. Application Data

(63) Continuation of application No. 16/534,743, filed on Aug. 7, 2019, now Pat. No. 11,088,107.

(60) Provisional application No. 62/715,419, filed on Aug. 7, 2018.

(51) Int. Cl.
| | |
|---|---|
| *H01L 23/00* | (2006.01) |
| *H01L 21/67* | (2006.01) |
| *C23C 14/02* | (2006.01) |
| *C23C 14/24* | (2006.01) |

(52) U.S. Cl.
CPC ......... *H01L 24/742* (2013.01); *C23C 14/022* (2013.01); *C23C 14/24* (2013.01); *H01L 24/11* (2013.01); *H01L 24/13* (2013.01); *H01L 21/67213* (2013.01); *H01L 2224/1145* (2013.01); *H01L 2224/13109* (2013.01)

(58) Field of Classification Search
CPC ......... H01L 2224/111; H01L 21/67207; H01L 21/67161
See application file for complete search history.

(56) References Cited

U.S. PATENT DOCUMENTS

2007/0202254 A1*  8/2007  Ganguli ............... C23C 16/56
                                                427/299

* cited by examiner

*Primary Examiner* — Kyoung Lee
(74) *Attorney, Agent, or Firm* — Head, Johnson, Kachigian & Wilkinson, PC

(57) ABSTRACT

A system and method are provided for depositing a substance onto a substrate, the system comprising: a chamber adapted to operate under high vacuum; an apparatus for receiving and cleaning the substrate to produce a clean substrate and for delivering the clean substrate to a coating position in the chamber under high vacuum; a carrier assembly for receiving the clean substrate from the apparatus and for retaining the substrate at the coating position; an evaporator adapted to hold a supply of the substance in the chamber and to evaporate and produce a discharge of the substance; and a collimator disposed within the chamber between the supply of the substance and the carrier assembly, the collimator being configured to define an aperture proximal to the substrate and to capture the discharge but for that which is directed through the aperture.

10 Claims, 15 Drawing Sheets

VACUUM DEPOSITION SYSTEM AND METHOD THEREOF

CROSS-REFERENCE TO RELATED APPLICATION

This application is a continuation application based on U.S. patent application Ser. No. 16/534,743, filed Aug. 7, 2019 entitled "Vacuum Deposition System and Method Thereof" which claims the benefit of U.S. Provisional Patent Application Ser. No. 62/715,419 filed Aug. 7, 2018.

BACKGROUND OF THE INVENTION

1. Field of the Invention

The present invention relates to systems and methods for deposition of a substance onto a substrate, and in particular, systems and methods for forming bump contacts for use in flip-chip bump bonding.

2. Prior Art

Indium bump bonding is a conventional method of connecting electronic chips to circuit boards. Indium solder bumps are often deposited over contact pads on both the chip and the board, and then the contact pads are aligned and pressed together to form an electrically conductive bond.

Various conventional deposition techniques have been developed for depositing a coating on a substrate and forming indium solder bumps. These techniques have been used in the past to produce 4 micron bump arrays on a wafer substrate. Given their application in the growing microLED field, an improved system and method for producing indium bump arrays, with potentially even smaller sizes, is desirable.

SUMMARY OF THE INVENTION

This disclosure provides a system for depositing a substance onto a substrate, the system comprising: a chamber adapted to operate under high vacuum; an apparatus for receiving and cleaning the substrate to produce a clean substrate and for delivering the clean substrate to a coating position in the chamber under high vacuum; a carrier assembly for receiving the clean substrate from the apparatus and for retaining the substrate at the coating position; an evaporator adapted to hold a supply of the substance in the chamber and to evaporate and produce a discharge of the substance; and a collimator disposed within the chamber between the supply of the substance and the carrier assembly, the collimator being configured to define an aperture proximal to the substrate and to capture the discharge but for that which is directed through the aperture.

This disclosure further provides a method for depositing a substance onto a substrate in a chamber adapted to operate under a high vacuum, the method comprising: cleaning the substrate under high vacuum to produce a clean substrate; while maintaining high vacuum, positioning the substrate within the chamber at a coating position producing a discharge of the substance in the chamber; capturing the discharge but for that which is directed through an aperture proximal to the substrate, and depositing the substance directed through the aperture onto the substrate.

Advantages and features of the invention will become evident upon a review of the following detailed description and the appended drawings, the latter being briefly described hereinafter.

BRIEF DESCRIPTION OF THE DRAWINGS

Reference will now be made, by way of example, to the accompanying drawings which show an example of the present application, in which.

DETAILED DESCRIPTION OF THE EXEMPLARY EMBODIMENT

Figure 1:
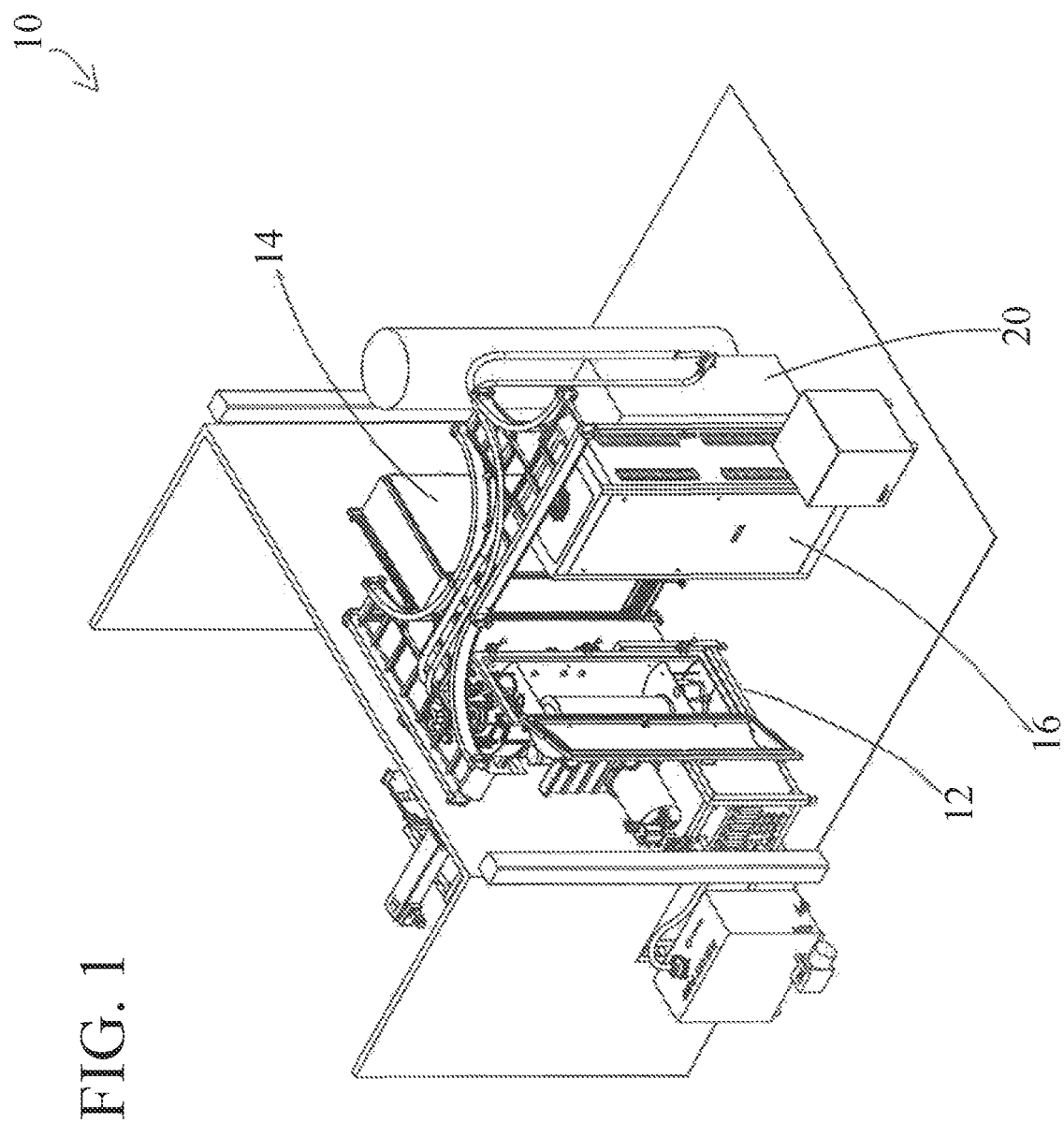
FIG. 1 is a front perspective view of a system according to the example of the present invention.
Figure 2:
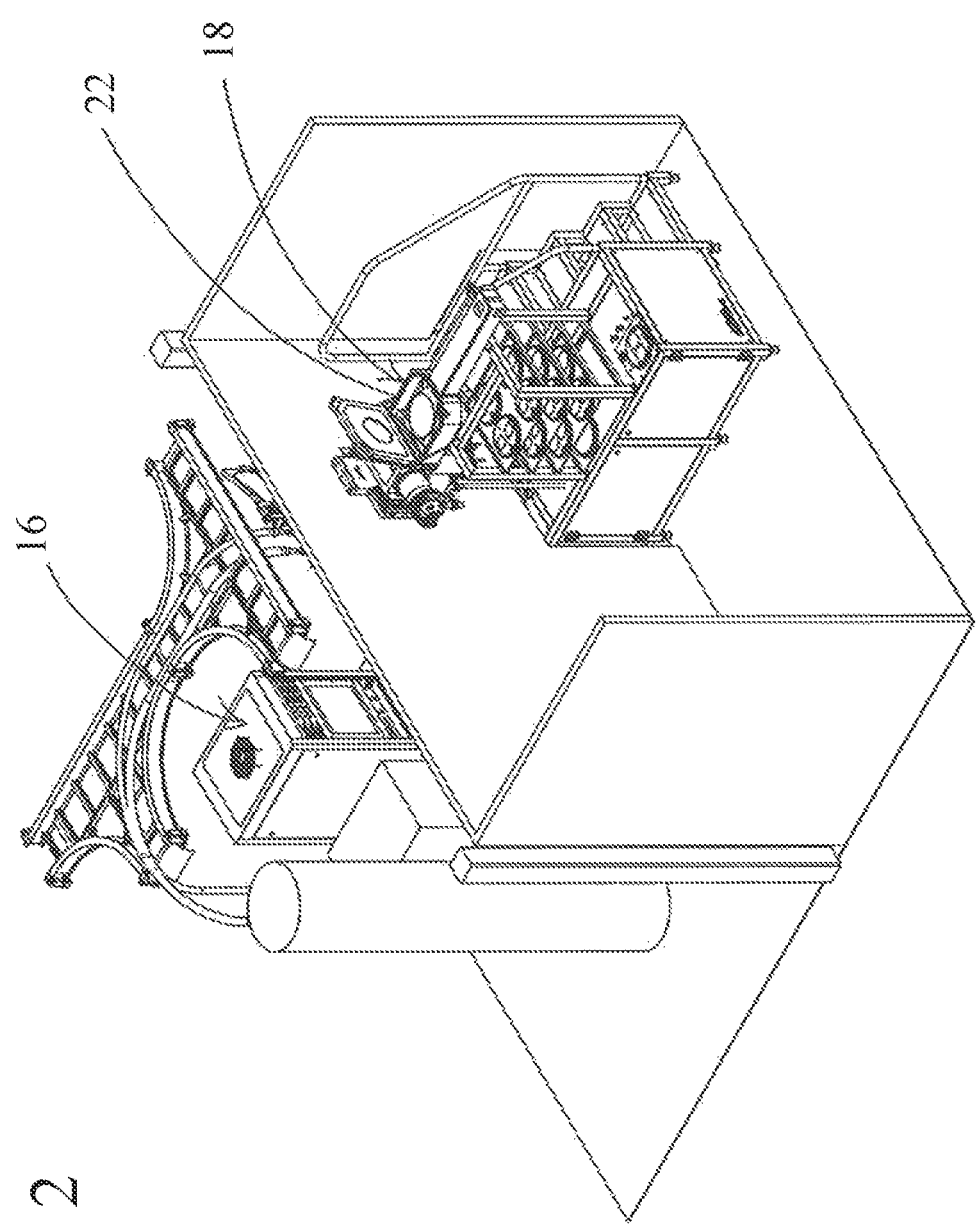
FIG. 2 is a first back perspective view of the system of FIG. 1.
Figure 3:
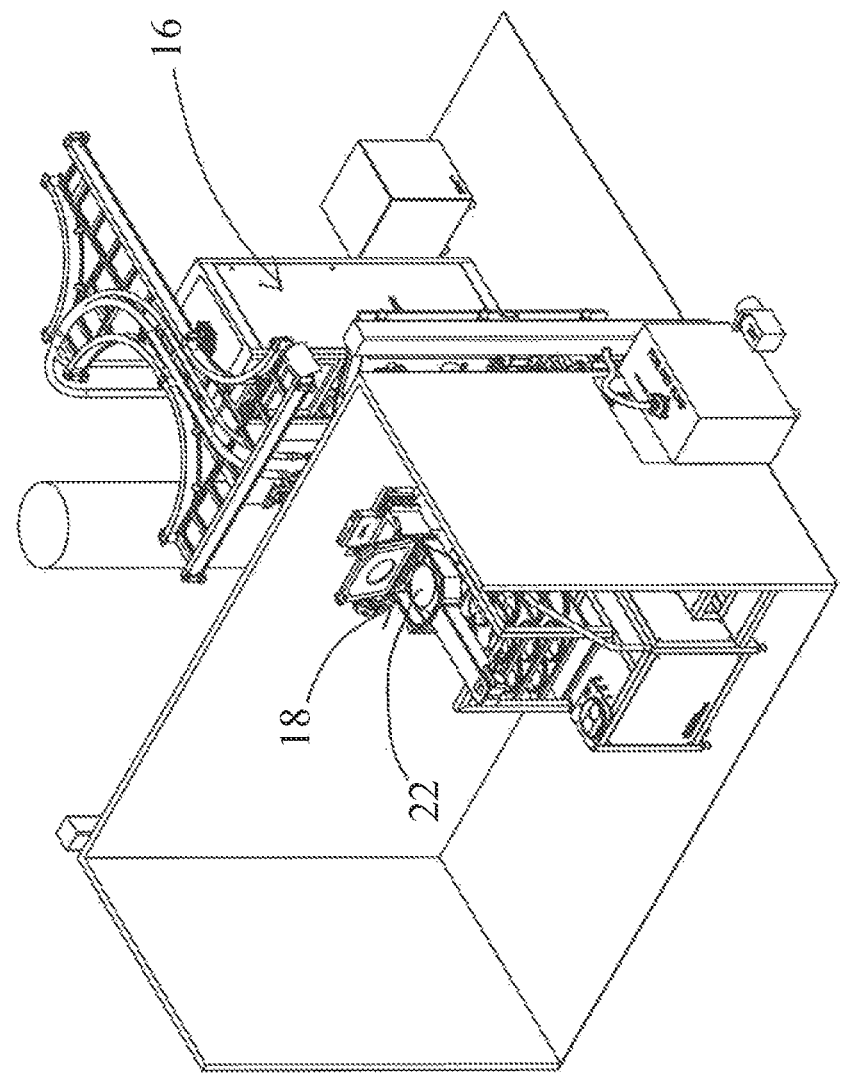
FIG. 3 is a second back perspective view of the system of FIG. 1.
Figure 4:
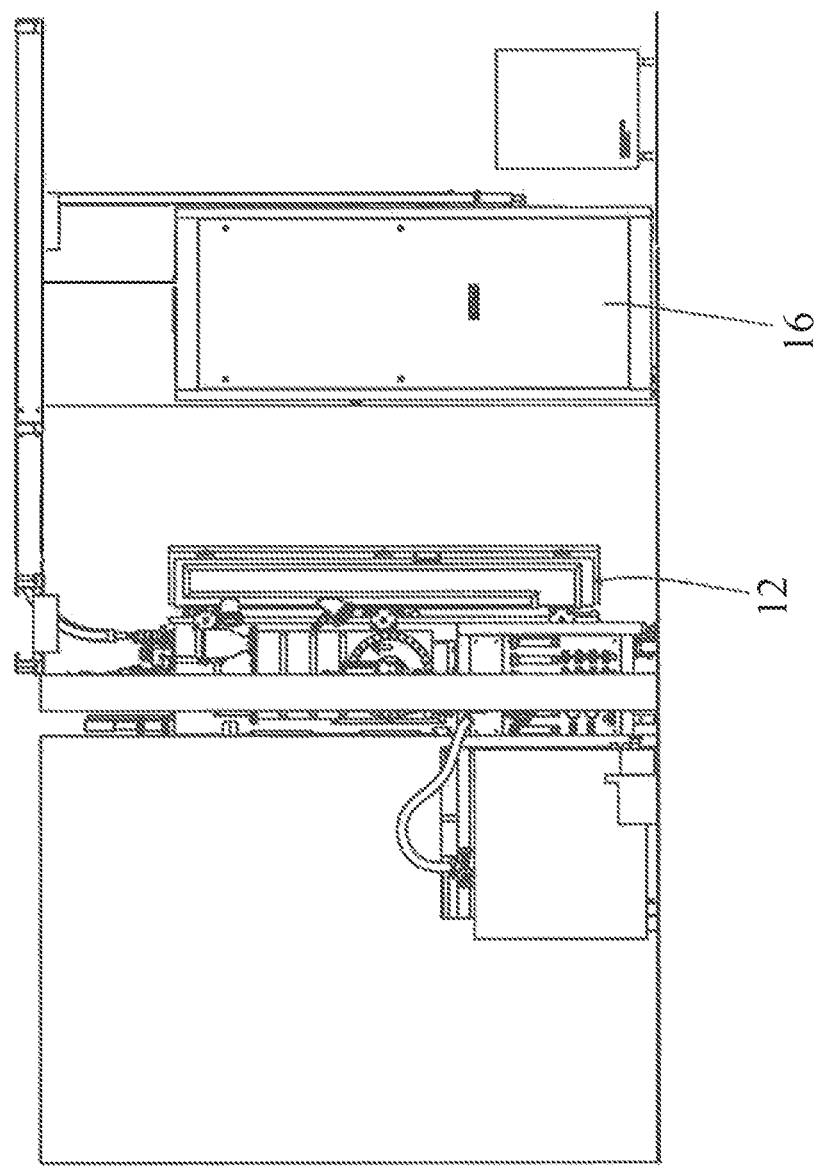
FIG. 4 is a left side view of the system of FIG. 1.
Figure 5:
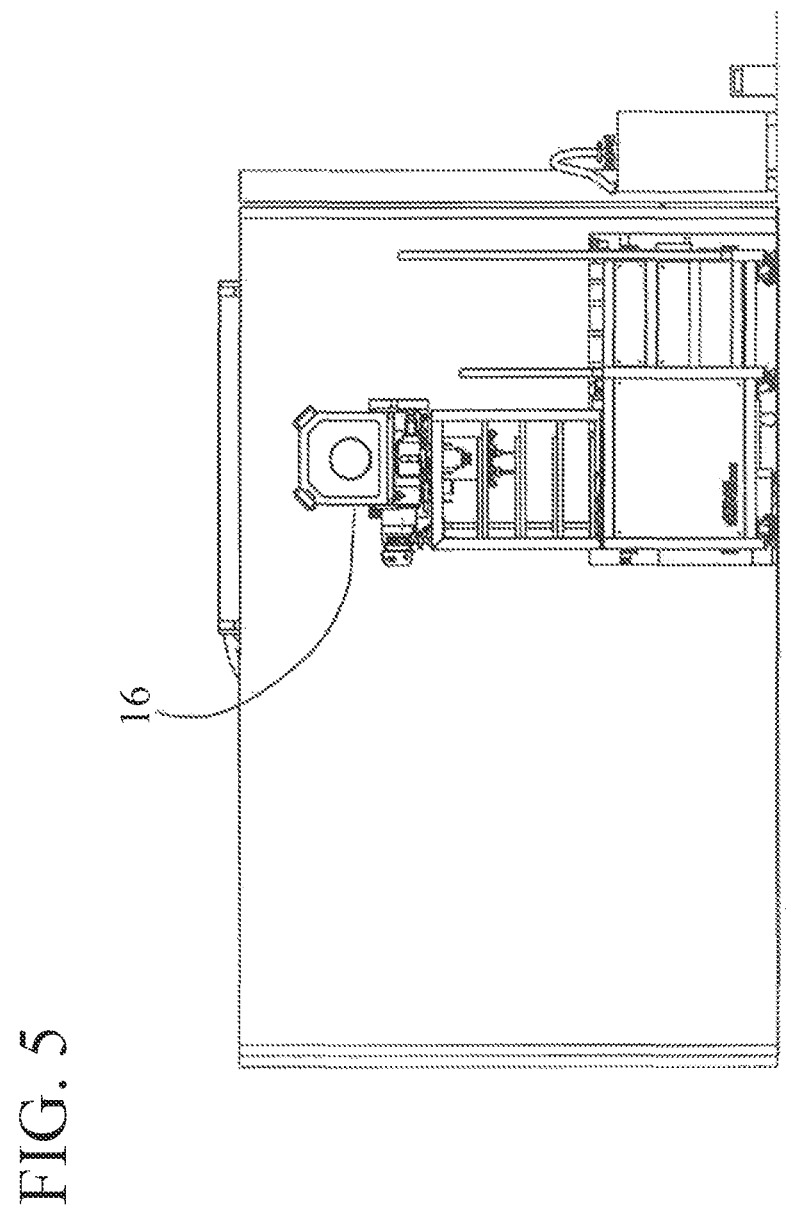
FIG. 5 is a back view of the system of FIG. 1.
Figure 6:
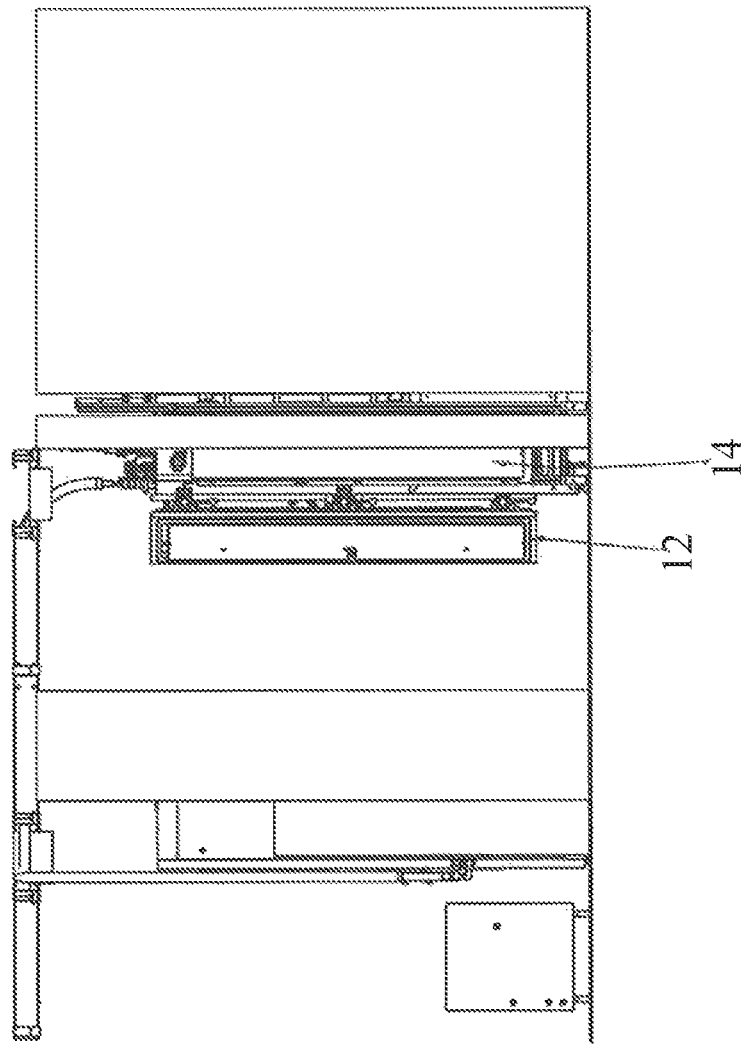
FIG. 6 is a right side view of the system of FIG. 1.
Figure 7:
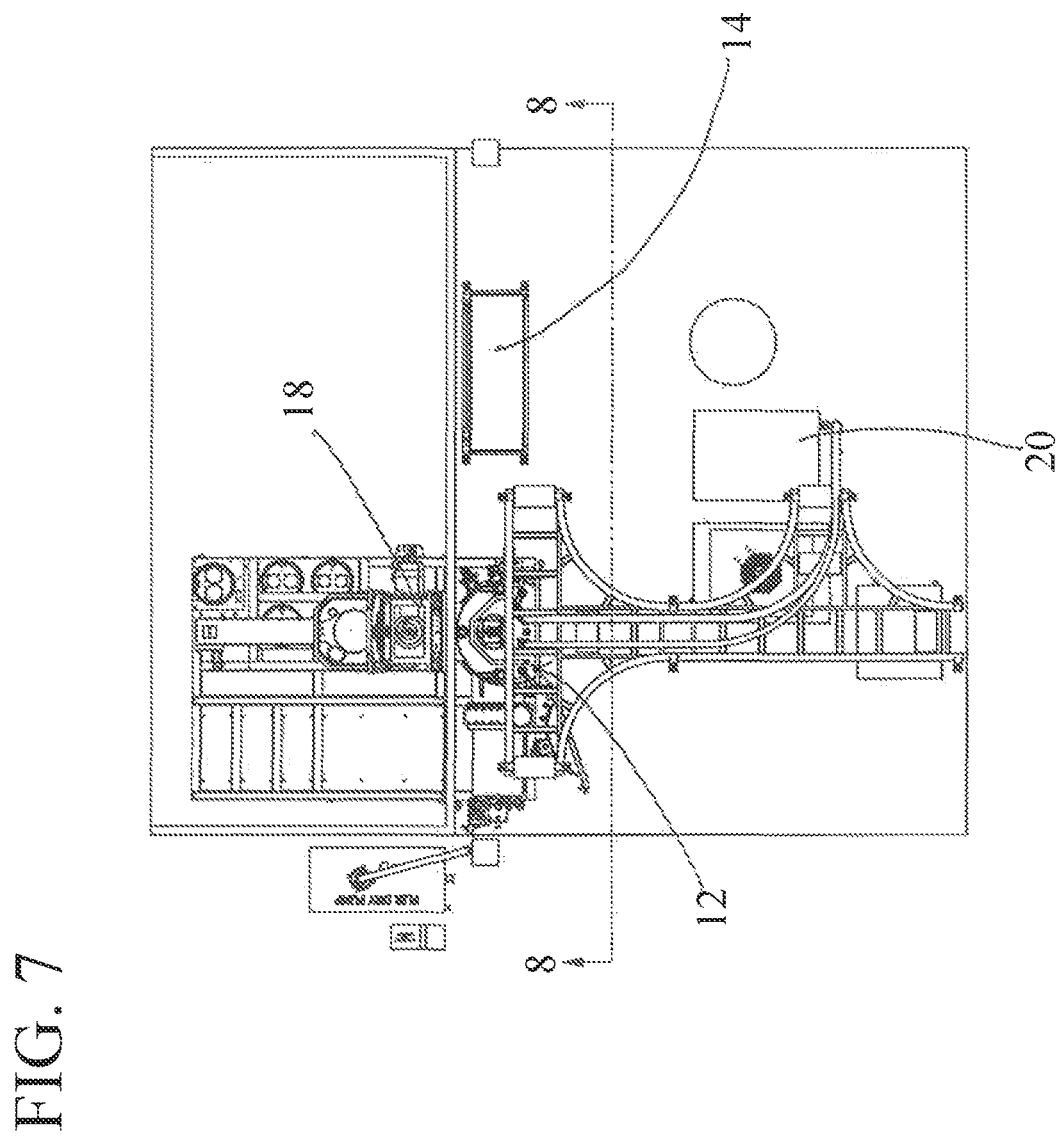
FIG. 7 is a plan view of the system of FIG. 1.
Figure 8:
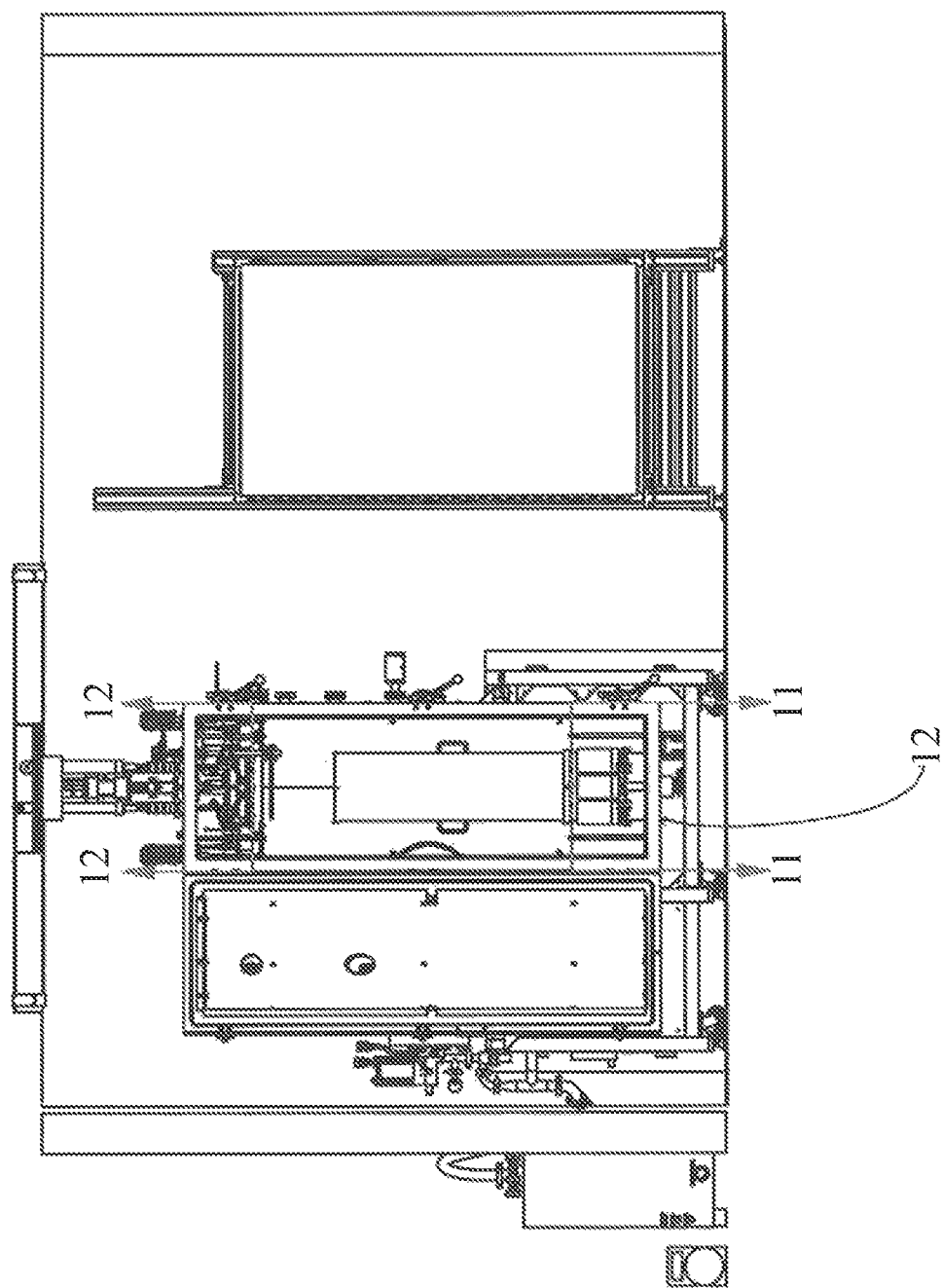
FIG. 8 is a cross-sectional view along line 8-8 of FIG. 7.

Example embodiments of the present system 10 and method 100 for metal deposition will be discussed. System 10 will first be described.

System

As seen in FIGS. 1-8, system 10 comprises a chamber portion 12 operatively coupled to a main power box 14, a system control unit 16, a cleaning apparatus 18 and a cooling system 20. System 10 may be used to deposit a substance onto a substrate, and in the embodiment depicted, to deposit indium onto a wafer. Cleaning apparatus 18, chamber portion 12 and cooling system 20 will each be discussed in greater detail below.

Cleaning apparatus 18 is adapted for receiving and cleaning the substrate or wafer and adapted to deliver the clean substrate to a coating position in chamber portion 12 under high vacuum. In particular, cleaning apparatus 18 is depicted to include a load-lock chamber 22. Load-lock chamber 22 is configured to receive a carrier disk 50, see FIGS. 13-18, which may hold one or two wafers (not shown). Carrier disk 50 has a radius of approximately 12 cm. Load-lock chamber 22 is also hermetically sealable. In this manner, load-lock chamber may be evacuated, and is, thereby, adapted to atomically clean the wafers in high vacuum. Atomically cleaning may involve ion beam cleaning the wafers.

Figure 9:
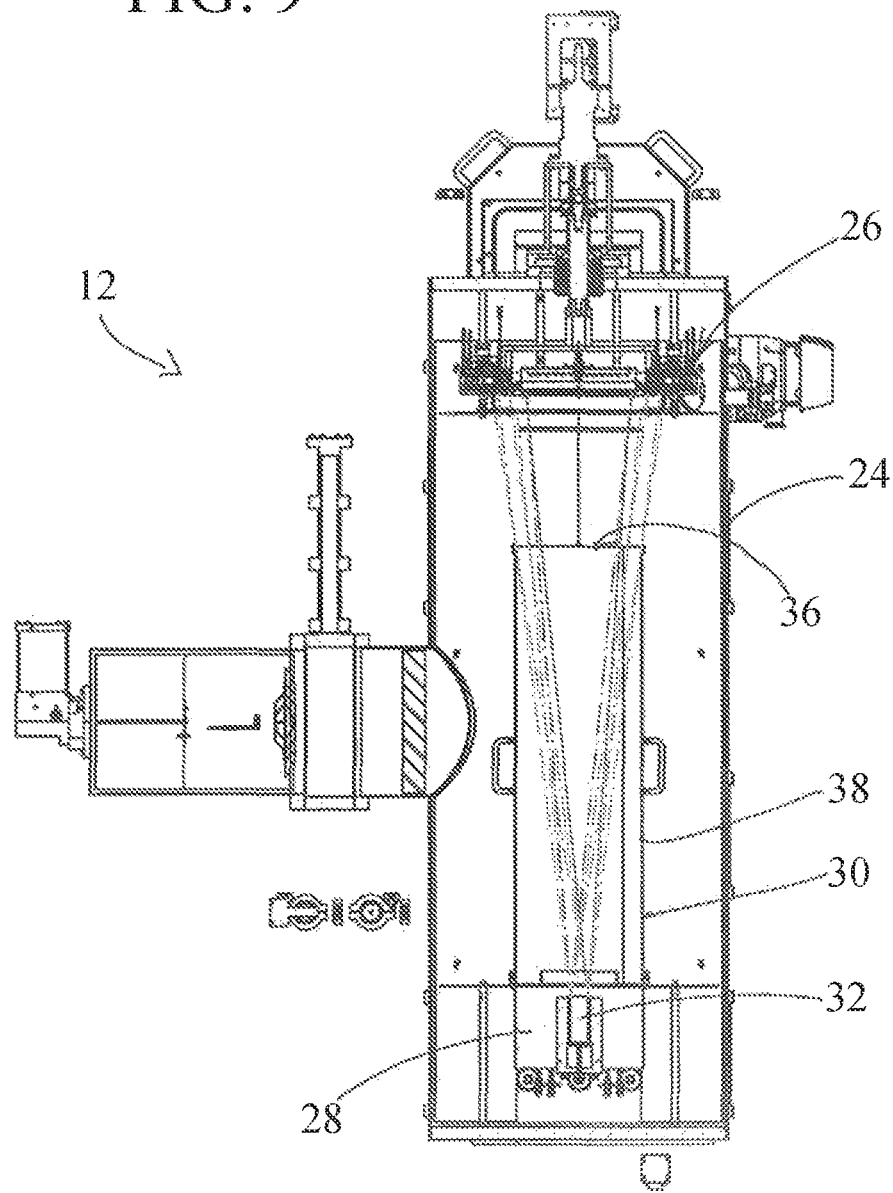
FIG. 9 is an enlarged, cross-sectional view of a chamber portion of the system of FIG. 1 according to one example.
Figure 10:
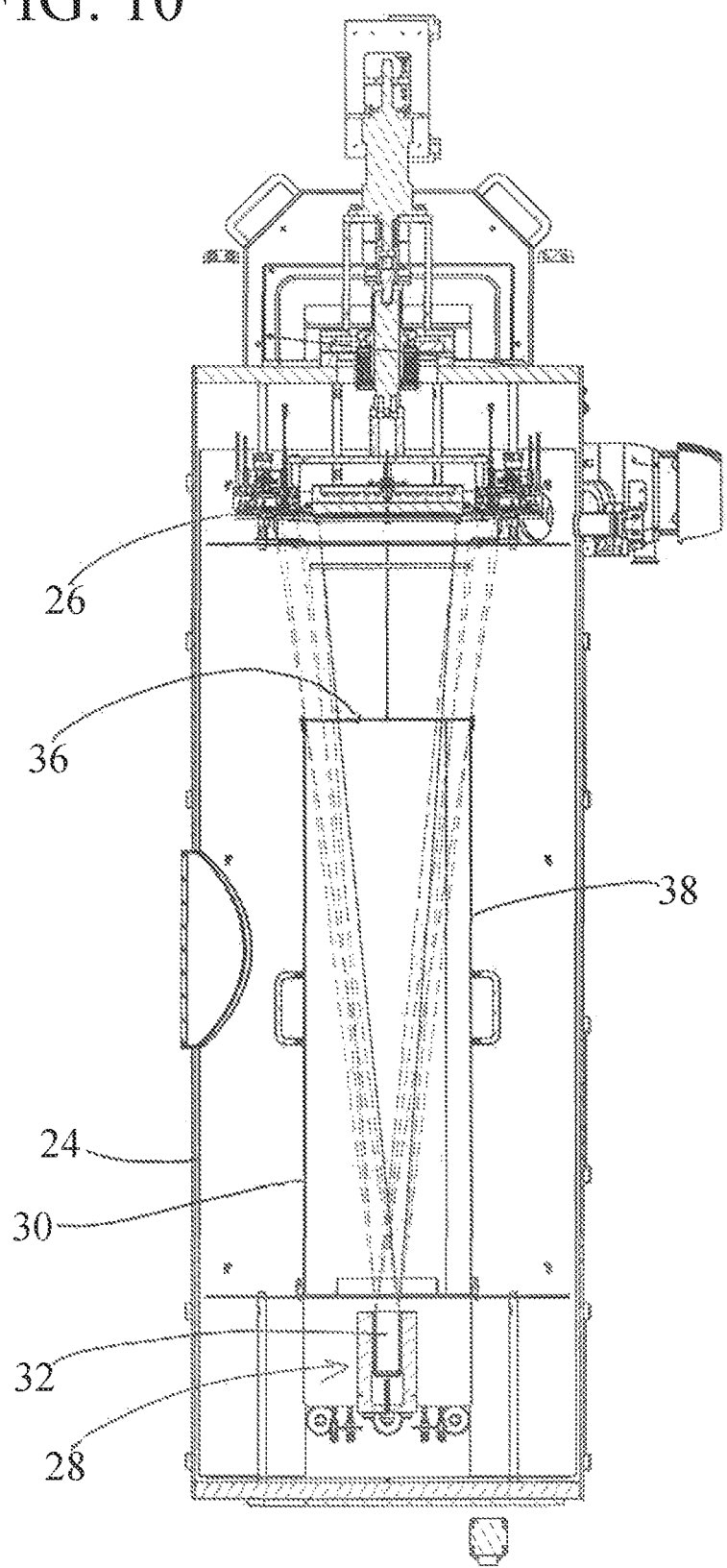
FIG. 10 is an enlarged, cross-sectional view of the chamber of FIG. 9 in isolation.

Chamber portion 12 is operatively coupled to load-lock chamber 22. FIGS. 9 and 10 depict chamber portion 12 having a chamber 24, which is approximately 1.9 m in length and adapted to operate under high vacuum, a carrier assembly 26 disposed at one end of chamber 24, an evaporator 28 disposed at the opposing end of chamber 24, and a collimator 30 disposed between carrier assembly 26 and evaporator 28.

Figure 12:
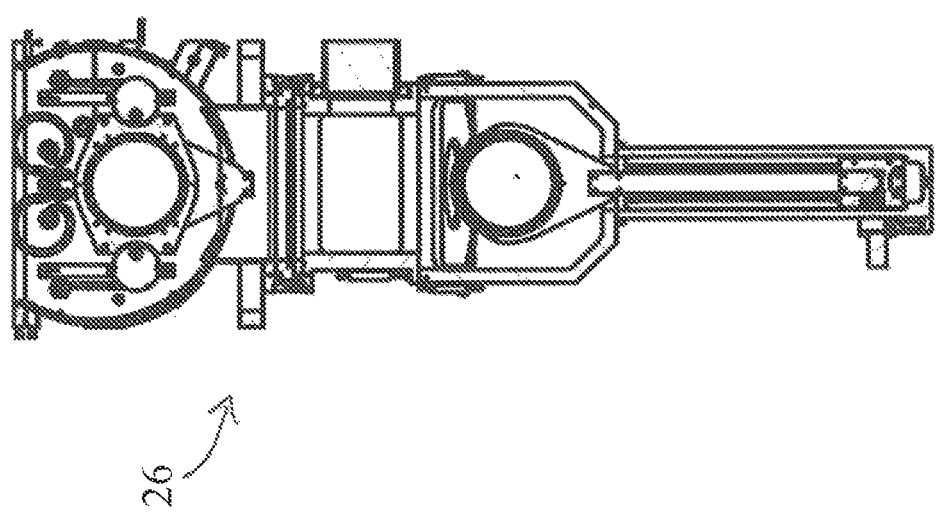
FIG. 12 is an enlarged, cross-sectional view along line 12-12 of FIG. 8.
Figure 13:
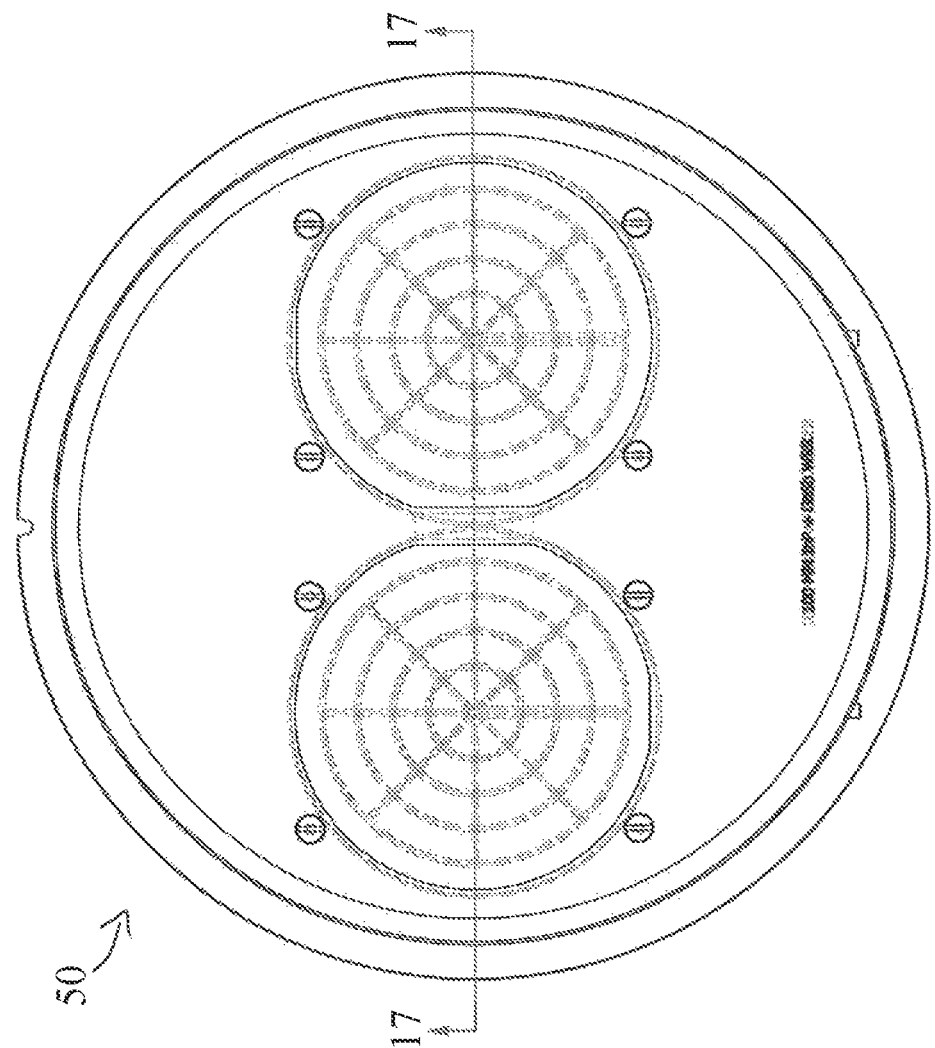
FIG. 13 is an enlarged bottom view of a carrier disk in isolation according to one example.
Figure 15:
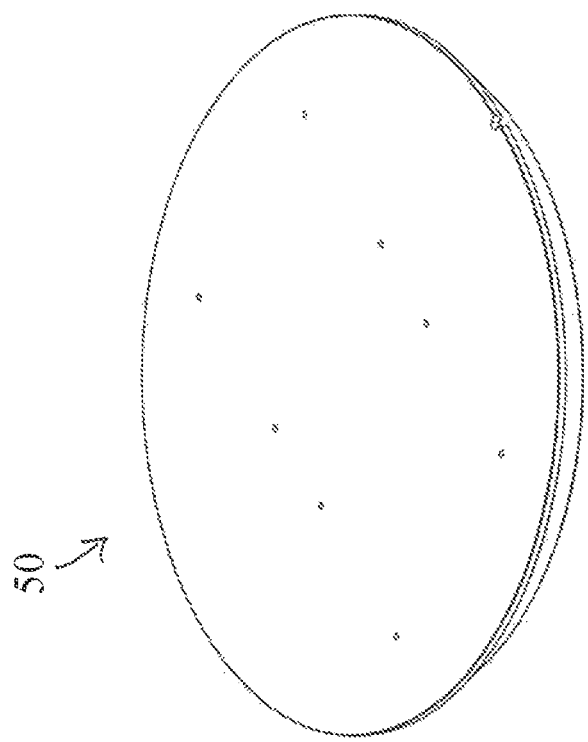
FIG. 15 is a top perspective view of the carrier disk of FIG. 13.
Figure 14:
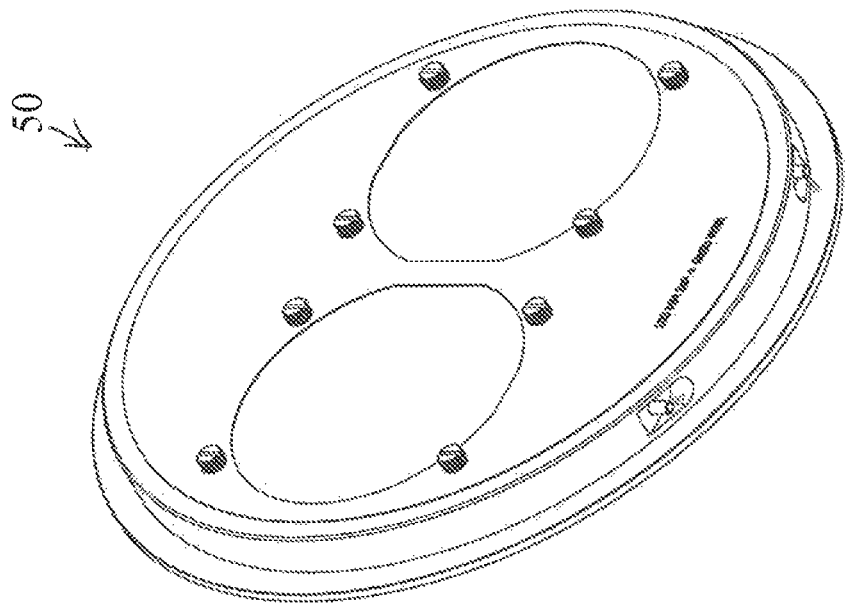
FIG. 14 is a bottom perspective view of the carrier disk of FIG. 13.
Figure 16:
FIG. 16 is a side view of the carrier disk of FIG. 13.
Figure 17:
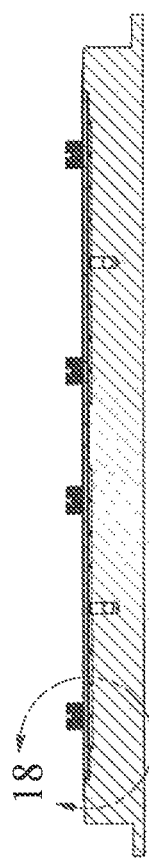
FIG. 17 is a cross-sectional view along line 17-17 of FIG. 13.
Figure 18:
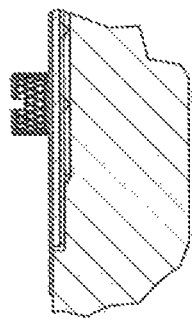
FIG. 18 is an enlarged view of portion 18 of FIG. 17.
Figure 19:
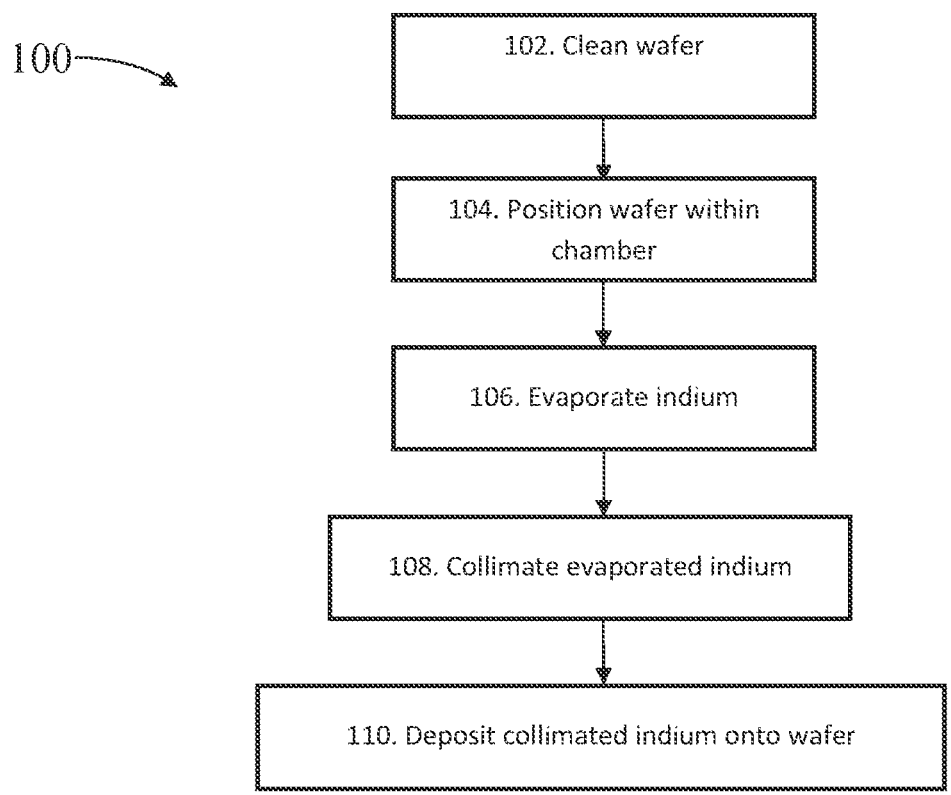
FIG. 19 is a flow diagram of a method according to an example of the present invention.

Carrier assembly 26 (see FIG. 12) is configured to receive a cleaned substrate from cleaning apparatus 18 and for retaining the wafer within chamber 24 at the coating position. The wafers are in the coating position when they are positioned face-down, towards the opposing end of chamber 24.

Figure 11:
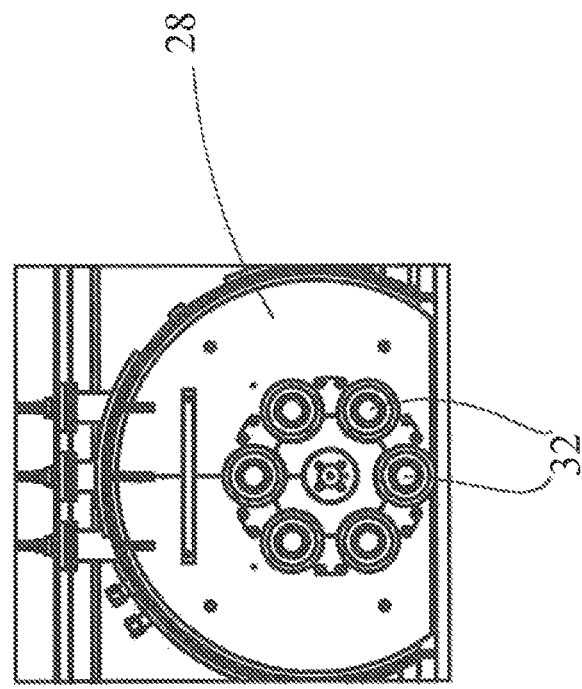
FIG. 11 is an enlarged, cross-sectional view along line 11-11 of FIG. 8.

Evaporator 28 is adapted to hold a supply of the substance, i.e. indium, in chamber 24 and to evaporate and produce a discharge of the indium. As shown, evaporator 28 is situated at or more than 1.2 meters from carrier assembly 26 within chamber 24. As best seen in FIG. 11, evaporator 28 comprises multiple crucibles 32 which hold the indium and may be rotated and individually heated. Each crucible 32 has an opening 34 which has a diameter of approximately 7.5 cm and is dimensioned to hold 60-100 cubic centimeters of indium. Evaporator 28 is configured to evaporate the substance to permit a rate of deposition on the substrate of approximately 30 angstroms/second.

Collimator 30, disposed between the supply of indium and carrier assembly 26, is configured to define an aperture 36 proximal to the substrate and is configured to capture the discharge but for that which is directed through aperture 36. Collimator 30 is shown to comprise a tube 38 which defines aperture 36.

As best seen in FIGS. 9 and 10, tube 38 has a length such that no line that extends through aperture 36 from the wafer/substrate to the indium source is disposed at an angle to the surface of the substrate less than 85 or greater than 95. Aperture 36 is circular with an area between 450 to 500 cm². In this depicted embodiment, tube 38 has a length of approximately 90 centimeters, and a radius of approximately 13 cm. In that regard, the ratio of
crucible diameter to
carrier disk diameter to
distance between the crucible and the carrier disk to
diameter of the tube to
length of the tube
is approximately 7.5:24:120:26:90.

Cooling system 20 is also operatively coupled to carrier assembly 26 for cooling the substrate to a predetermined temperature. The predetermined temperature may be −45° C. or less. Cooling system 20 is also adapted to dynamically maintain the substrate at about the predetermined temperature during deposition, where the cooling demands are tied to the heat of condensation Whereas a specific embodiment of the system is herein shown and described, variations are possible.

In some examples, not shown in the Figures, rather than a tube, collimator 30 may instead comprise one or more plates which each have an opening that defines aperture 36.
Method System 10 may be used in performance of method 100 for depositing a substance, such an indium, onto a substrate, such as a wafer, in chamber 24 adapted to operate under a high vacuum.

At 102, the substrate or wafer is cleaned in cleaning apparatus 18 to produce a clean substrate. As the wafer is cleaned in a high vacuum, the wafer is atomically cleaned, such as with an ion beam in high vacuum.

At 104, the cleaned substrate is positioned within chamber 24 at the coating position where the exposed face of the wafer directed towards aperture 36 of collimator 30.

At 106, the substance or indium is evaporated in evaporator 28 which produces a discharge of the indium into chamber 24. In particular, the indium is evaporated by heating one of the multiple of crucibles 32 which are holding the indium therein. Crucibles 32 may also be rotated before being heated when the substance within the heated crucible is depleted.

At 108, the evaporated indium discharge is collimated through tube 38 which is proximal to evaporator 28 to capture the discharge that is not directed through aperture 36.

At 110, the evaporated indium that does travel through aperture 36 is deposited onto the wafer or substrate. In the present method, the rate of deposition is approximately 30 angstroms/second.

Whereas a specific embodiment of the method is herein shown and described, variations are possible.

In some examples, method 100 may further include cooling the substrate/wafer to a predetermined temperature prior to the depositing and maintaining the substrate at about the predetermined temperature during the depositing. In particular, the cooling may include cooling the substrate/wafer to −45° C. or less.
Advantages An advantage of the present invention is that system 10 and method 100 may be used to form bump arrays on the clean substrate where each bump is a diameter of two micron, or smaller. In particular, bumps as small as 10 nanometers may be formed. A photo resist, with 2 micron, or less, cavities may be first applied to the wafer before they are inserted into system 10 for deposition. After deposition, the photo resist may be rinsed away, leaving 2 micron bumps on the wafer.

Another advantage of the invention is that the combination of the use of vacuumed cleaning, vacuumed chamber, dynamic cooling of the substrate/wafer during deposition, and the multiple, rotatable crucibles from which the indium is evaporated, allows for multiple wafers to be processed with indium bumps between service intervals. In other words, many wafers can be produced without having to evacuate the chamber between each deposition process. Service intervals may also involve cleaning the collimator and refilling the crucibles, which is time consuming.

Accordingly, the invention should be understood to be limited only by the accompanying claims, purposively construed.

What is claimed is:

1. A method for depositing a substance onto a substrate in a chamber adapted to operate under a high vacuum, the method comprising:
cleaning the substrate under high vacuum to produce a clean substrate;
positioning the substrate within the chamber at a coating position while maintaining high vacuum;
producing a discharge of the substance into the chamber;
capturing the discharge but for that which is directed through an aperture proximal to the substrate, wherein said capturing comprises collimating the substance through a collimator which defines the aperture proximal to the substrate; and
depositing the substance directed through the aperture onto the substrate.

2. The method of claim 1 wherein the step of producing a discharge comprises evaporating the substance in an evaporator.

3. The method of claim 1, wherein the aperture is circular with an area between 450 to 500 cm$^2$.

4. The method of claim 3, wherein the cleaning step comprises atomically cleaning the substrate.

5. The method of claim 4, further comprising cooling the substrate to a predetermined temperature prior to the depositing step and maintaining the substrate at the predetermined temperature during the depositing.

6. The method of claim 5, wherein the cooling step comprising cooling the substrate to −45° C. or less.

7. The method of claim 6, wherein the evaporating step comprises heating one of a multiple of crucibles holding the substance, and changing the crucible to be heated when the substance within the heated crucible is depleted.

8. The method of claim 7, wherein the depositing step is performed at a rate of 30 angstroms/second.

9. The method of claim 8, further comprising applying a photo resist onto the substrate with two micron, or smaller, bump cavities, such that the depositing of the evaporated substance on the substrate forms bumps having a two micron, or smaller, diameter.

10. The method of claim 8, wherein the photo resist applied onto the substrate has 10 nanometer cavities, such that the depositing of the evaporated substance onto the substrate forms bumps having a 10 nanometer diameter.

\* \* \* \* \*